United States Patent
Ko et al.

(10) Patent No.: US 8,013,365 B2
(45) Date of Patent: Sep. 6, 2011

(54) CMOS IMAGE SENSOR CONFIGURED TO PROVIDE REDUCED LEAKAGE CURRENT

(75) Inventors: Ju-hyun Ko, Gyeonggi-do (KR); Jong-jin Lee, Seoul (KR); Jung-chak Ahn, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 237 days.

(21) Appl. No.: 12/403,794

(22) Filed: Mar. 13, 2009

(65) Prior Publication Data

US 2009/0230444 A1 Sep. 17, 2009

(30) Foreign Application Priority Data

Mar. 13, 2008 (KR) ........................ 10-2008-0023472

(51) Int. Cl.
*H01L 29/66* (2006.01)

(52) U.S. Cl. ........ 257/239; 257/221; 257/225; 257/233; 257/292; 257/432; 257/461; 257/E31.079

(58) Field of Classification Search .................. 257/219, 257/221, 222, 225, 226, 229, 233, 239, 257, 257/258, 290–292, 431, 432, 461, 462, E31.053, 257/E31.073, E31.079; 438/57, 69
See application file for complete search history.

(56) References Cited

U.S. PATENT DOCUMENTS 5,309,007 A 5/1994 Kelner et al.

(Continued)

FOREIGN PATENT DOCUMENTS

JP 2578615 B2 * 8/1996

(Continued)

OTHER PUBLICATIONS

Chaudhry et al. "Controlling Short-Channel Effects in Deep-Submicron SOI MOSFETs for Improved Reliability: A Review" *IEEE Transactions on Device and Materials Reliability*; vol. 4.; No. 1; pp. 99-109; Mar. 2004.

*Primary Examiner* — Matthew C Landau
*Assistant Examiner* — Joseph C Nicely
(74) *Attorney, Agent, or Firm* — Myers Bigel Sibley & Sajovec, P.A.

(57) ABSTRACT

A complementary metal-oxide-semiconductor (CMOS) image sensor (CIS) includes a semiconductor substrate including a photodiode therein as a light sensing unit. A floating diffusion region of a first conductivity type is provided in the semiconductor substrate, and is configured to receive charges generated in the photodiode. A power supply voltage region of the first conductivity type is also provided in the semiconductor substrate. A reset transistor including a reset gate electrode on a surface of the substrate between the floating diffusion region and a power supply voltage region is configured to discharge charges stored in the floating diffusion region in response to a reset control signal. The reset transistor includes a channel region in the substrate extending between the floating diffusion region and the power supply voltage region such that the floating diffusion region and the power supply voltage regions define source/drain regions for the reset transistor. An impurity region is provided in a first portion of the channel region adjacent to the floating diffusion region. The impurity region has a doping such that the first portion of the channel region adjacent to the floating diffusion region has a different built-in potential than a second portion of the channel region adjacent to the power supply voltage region.

17 Claims, 4 Drawing Sheets

U.S. PATENT DOCUMENTS

| | | | |
|---|---|---|---|
| 6,051,470 A | 4/2000 | An et al. | |
| 6,677,656 B2 | 1/2004 | Francois | |
| 6,724,060 B2 * | 4/2004 | Maeda | 257/431 |
| 7,387,908 B2 * | 6/2008 | Patrick | 438/73 |
| 7,595,210 B2 * | 9/2009 | Shim | 438/57 |
| 2002/0079518 A1 * | 6/2002 | Maeda | 257/226 |
| 2003/0089929 A1 * | 5/2003 | Rhodes | 257/219 |
| 2005/0051701 A1 * | 3/2005 | Hong | 250/214.1 |
| 2007/0045668 A1 * | 3/2007 | Brady et al. | 257/219 |
| 2007/0108476 A1 * | 5/2007 | Hong | 257/225 |
| 2007/0128820 A1 | 6/2007 | Majumdar et al. | |
| 2007/0158713 A1 * | 7/2007 | Ohkawa | 257/292 |
| 2007/0278537 A1 * | 12/2007 | Haraguchi | 257/239 |
| 2008/0042170 A1 * | 2/2008 | Han | 257/229 |
| 2010/0270530 A1 * | 10/2010 | Park et al. | 257/9 |

FOREIGN PATENT DOCUMENTS

| | | |
|---|---|---|
| KR | 1020050018512 A | 2/2005 |
| KR | 1020060133742 A | 12/2006 |
| KR | 1020070071039 A | 7/2007 |

* cited by examiner

CMOS IMAGE SENSOR CONFIGURED TO PROVIDE REDUCED LEAKAGE CURRENT

CROSS-REFERENCE TO RELATED APPLICATIONS

This application claims the benefit of Korean Patent Application No. 10-2008-0023472, filed on Mar. 13, 2008, in the Korean Intellectual Property Office, the disclosure of which is incorporated herein in its entirety by reference.

FIELD OF THE INVENTION

The present invention relates to complementary metal-oxide-semiconductor (CMOS) devices, and more particularly, to CMOS image sensors (CIS).

BACKGROUND

CMOS image sensors (CIS) may convert an external optical image signal into an electrical image signal. A CIS may provide a lower operational voltage and reduced power consumption in conjunction to a charge-coupled device (CCD) image sensor. A CIS may also provide high integration, and thus, may be widely used in many fields.

FIG. 1 is a circuit diagram of a unit pixel 10 of a conventional CMOS image sensor (CIS). The unit pixel 10 can be implemented in various forms. A unit pixel 10 having a 4-transistor structure is illustrated in FIG. 1. As illustrated in FIG. 1, the unit pixel 10 includes a photodiode PD for generating optical charges due to incident light, and a plurality of transistors T1-T4. A transfer transistor T1 transfers optical charges gathered in the photodiode PD to a floating diffusion region FD in response to a transmission control signal Tx. In addition, a reset transistor T2 resets the potential of the floating diffusion region FD to the level of a predetermined power supply voltage VDD in response to a reset signal Rx and discharges optical charges stored in the floating diffusion region FD.

In addition, a drive transistor T3 acts as a source follower-buffer amplifier, and a selection transistor T4 is used for addressing. The selection transistor T4 is switched in response to a selection control signal Sx and transmits an output signal in the unit pixel 10 to the outside through an output terminal OUT.

In a correlated double sampling (CDS) operation that is generally performed in a CIS, the floating diffusion region FD may temporarily store electrons integrated or accumulated in the photodiode PD. Electrical characteristics may be further deteriorated in the floating diffusion region FD than in the photodiode PD. However, in the floating diffusion region FD, the electrons may be stored only for a relatively short time of about several tens to hundreds of nanoseconds (ns). The effect of leakage current may therefore be less than in the photodiode PD.

However, in methods such as global shutter and FD well capacitor adjustment, as the duration of the electron storage in the floating diffusion region FD increases, problems may occur due to the leakage current in the floating diffusion region FD. In other words, as the time during which electrons are stored in the floating diffusion region FD increases, image quality may be deteriorated due to the leakage current in the floating diffusion region FD.

SUMMARY

According to some embodiments, a complementary metal-oxide-semiconductor (CMOS) image sensor (CIS) includes a semiconductor substrate including a photodiode therein as a light sensing unit; a floating diffusion region of a first conductivity type formed by injecting a first conductivity type impurity in the substrate, the floating diffusion region being configured to receive charges generated in the photodiode according to a switching operation of a transfer transistor; a power supply voltage region of the first conductivity type in the semiconductor substrate; and a reset transistor that is connected between the floating diffusion region and the power supply voltage region and configured to discharge charges stored in the floating diffusion region in response to a reset control signal. The reset transistor includes a channel region in the substrate extending between the floating diffusion region and the power supply voltage region such that the floating diffusion region and the power supply voltage regions define source/drain regions for the reset transistor. The channel region includes an impurity region in a first portion of the channel region that is adjacent to the floating diffusion region. The impurity region has a doping such that the first portion of the channel region adjacent to the floating diffusion region has a different built-in potential than a second portion of the channel region that is adjacent to the power supply voltage region.

In other embodiments, the channel region of the reset transistor may be doped so that a voltage potential of the second portion of the channel region may be higher than a voltage potential of the first portion of the channel region.

In some embodiments, the first portion of the channel region may be doped with a second conductivity type impurity, and the second portion of the channel region may be doped with a first conductivity type impurity. For example, the first conductivity type impurity may be an n-type impurity, and the second conductivity type impurity may be a p-type impurity.

In some embodiments, the first portion of the channel region may have a lower concentration of the first conductivity type impurity than the second portion of the channel region.

In other embodiments, a peripheral portion of the floating diffusion region may include a second conductivity type impurity region between the floating diffusion region and a device isolation layer.

In some embodiments, the floating diffusion region may include a first region of a second conductivity type at a surface thereof, and a second region of a first conductivity type at the surface thereof adjacent the first region. The CMOS image sensor may further include a conductive layer on the second region that may electrically connect the floating diffusion region to another device.

In other embodiments, the second region at the surface of the floating diffusion region may include the first conductivity type impurity at a higher concentration than other portions of the floating diffusion region, and the conductive layer may be on the second region.

In some embodiments, the first portion of the channel region adjacent to the floating diffusion region may have a different conductivity than the second portion of the channel region adjacent to the power supply voltage region.

According to other embodiments, a complementary metal-oxide-semiconductor (CMOS) image sensor (CIS) includes a semiconductor substrate including a photodiode therein as a light sensing unit; a floating diffusion region of a first conductivity type which is formed by injecting a first conductivity type impurity into the substrate, the floating diffusion region being configured to receive charges generated in the photodiode according to a switching operation of a transfer transistor and comprising a first region of a second conductivity type at a surface thereof, and a second region of the first conductivity type at the surface thereof adjacent the first region; a power supply voltage region of the first conductivity type in the semiconductor substrate; a reset transistor which is connected between the floating diffusion region and the power supply voltage region and configured to discharge the charges stored in the floating diffusion region in response to a reset control signal; and a conductive layer on the second region and configured to electrically connect the floating diffusion region to another device.

According to still other embodiments, a complementary metal-oxide-semiconductor (CMOS) image sensor (CIS) includes a semiconductor substrate including a photodiode therein as a light sensing unit; a floating diffusion region of a first conductivity type that is formed by injecting a first type impurity into the substrate, the floating diffusion region being configured to receive charges generated in the photodiode according to a switching operation of a transfer transistor; and a reset transistor that is connected between the floating diffusion region and the power supply voltage region and is configured to discharge the charges stored in the floating diffusion region in response to a reset control signal; a device isolation layer on the substrate adjacent to the floating diffusion region; and an impurity region of a second conductivity type separating the floating diffusion region from the device isolation layer. The impurity region may surround a peripheral portion of the floating diffusion region.

DETAILED DESCRIPTION

Figure 1:
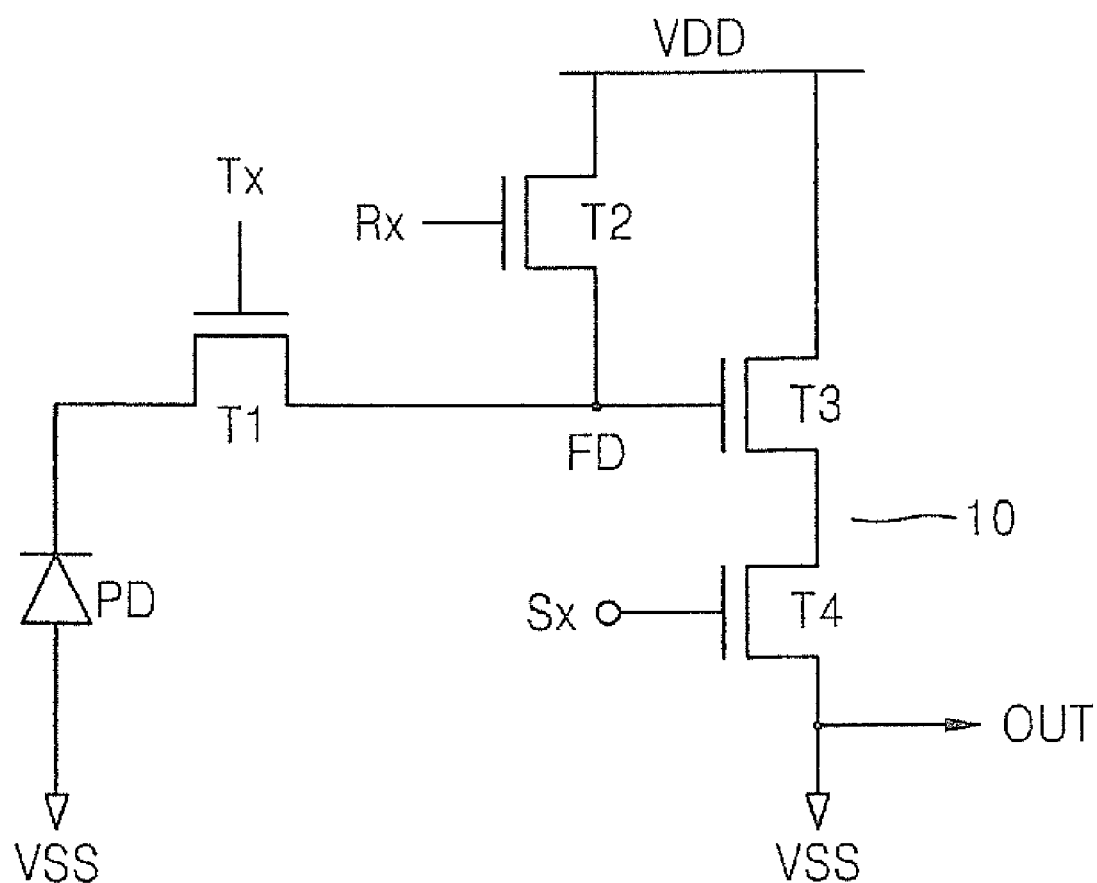
FIG. 1 is a circuit diagram of a unit pixel of a conventional CMOS image sensor (CIS)

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

Figure 2:
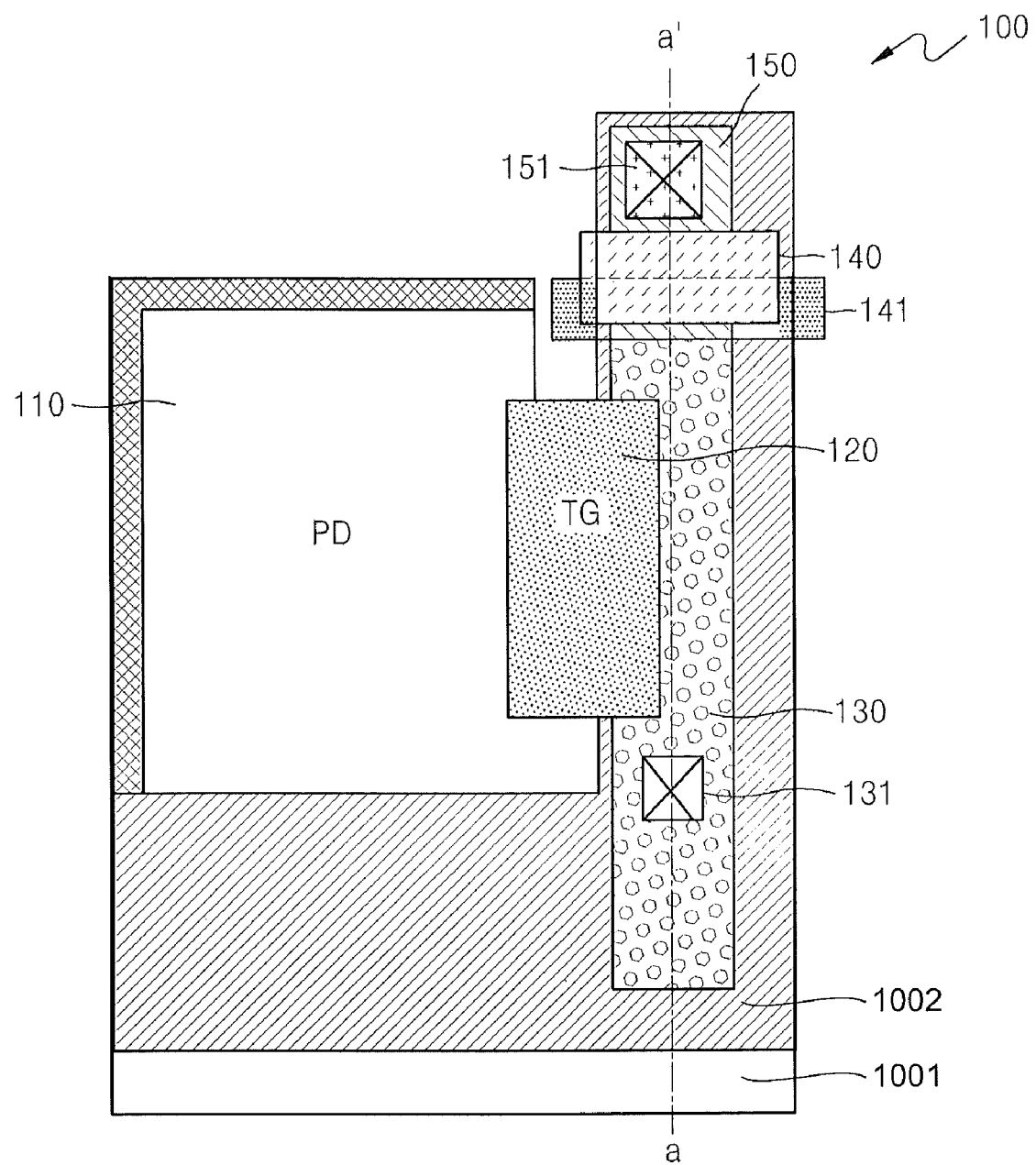
FIG. 2 is a plan view of a portion of a pixel structure of a CMOS image sensor (CIS) according to some embodiments of the present invention.

FIG. 2 is a plan view of a portion of a pixel structure of a CMOS image sensor (CIS) according to some embodiments of the present invention. A device isolation layer (not shown) is formed on a semiconductor substrate (not shown), for example, on a p-type silicon substrate, by using well-known methods, thereby defining an active region. A photodiode and transistors for controlling transmission of electrons generated in the photodiode are formed in the defined active region of the semiconductor substrate.

As illustrated in FIG. 2, n-type impurity ions and p-type impurity ions are doped into a predetermined region of a unit pixel 100 of the CIS, thereby forming a photodiode 110 as a light sensing unit. In addition, a transfer gate 120 (TG) of a transfer transistor for controlling transfer of electrons from the photodiode 110 is formed adjacent to the photodiode 110. In addition, a first conductivity type impurity, for example, n– or n+ impurity ions, are doped into a region of the unit pixel 100 of the CIS, thereby forming a floating diffusion region 130 (FD). The transfer transistor is switched in response to a control signal supplied to the transfer gate 120. When the transfer transistor is in an on-state, electrons integrated or accumulated in the photodiode 110 are transferred to the floating diffusion region 130 (FD).

Meanwhile, the floating diffusion region 130 (FD) is connected to a power supply voltage VDD via a reset transistor. As illustrated in FIG. 2, a reset gate 140 (RG) of a reset transistor is adjacent to the floating diffusion region 130 so as to form the reset transistor. In addition, a power supply voltage region 150 may be formed by doping the substrate using a first conductivity type impurity, for example, n+ impurity ions, and the power supply voltage VDD is supplied to the power supply voltage region 150 via a contact 151. The reset transistor is switched in response to a control signal supplied to the reset gate 140 (RG). When the reset transistor is in an on-state, the potential of the floating diffusion region 130 (FD) is reset to the level of the power supply voltage VDD so that electrons stored in the floating diffusion region 130 (FD) are discharged.

In the CIS in which methods such as global shutter or FD well capacity adjustment etc. are used, the duration for storing electrons in the floating diffusion region 130 (FD) may increase. Thus, leakage current in the floating diffusion region 130 (FD) may become problematic. As such, in embodiments of the present invention, the built-in potential (also referred to as a "built-in voltage") of a channel region corresponding to the reset transistor, i.e., the potential of a channel region formed below the reset gate 140 (RG), is not uniform. In particular, the channel region of the reset transistor extends between the floating diffusion region 130 (FD) and the power supply voltage region 150. The channel region of the reset transistor includes an impurity region therein, which is doped so that the potential of the channel region that is adjacent to the floating diffusion region 130 and the potential of the channel region that is adjacent to the power supply voltage region 150 are different from each other. In other words, the channel region of the reset transistor is non-uniformly doped to reduce leakage, such that a portion 141 of the channel region adjacent to the floating diffusion region 130 has a different conductivity than a portion 142 of the channel region adjacent to the power supply voltage region 150.

The built-in potential of a portion 141 of a channel region of the reset transistor that is adjacent to the floating diffusion region 130 may be smaller than the built-in potential of a portion 142 of the channel region that is adjacent to the power supply voltage region 150. To this end, a second conductivity type impurity, for example, a p-type impurity, is doped into the portion 141 of the channel region adjacent to the floating diffusion region 130. The p-type impurity is not doped into the other portion 142 of the channel region that is adjacent to the power supply voltage region 150. In some embodiments, at least the portion of the channel region of the reset gate 140 adjacent to the power supply voltage region 150 may also be doped with a first conductivity-type impurity to provide a relatively high-concentration region of the first conductivity type adjacent to the power supply voltage region 150. As such, when the p-type impurity is doped in the portion 141 of the channel region adjacent to the floating diffusion region 130, the other portion 142 of the channel region adjacent to the power supply voltage region 150 may maintain the first type (n-type) conductivity. In the method described above, the potential of the channel region of the reset transistor increases from the floating diffusion region 130 (FD) to the power supply voltage region 150. As such, leakage electrons that are generated in the reset transistor may be more easily moved to the power supply voltage region 150 than to the floating diffusion region 130 (FD) so that deterioration of image quality due to leakage of the electrons can be prevented.

In other embodiments, the built-in potential of the channel region of the reset transistor may be non uniform such that the portion 141 of the channel region of the reset transistor can be doped with a first conductivity type impurity (for example, an n-type impurity). In other words, the portion 141 of the channel region adjacent to the floating diffusion region 130 may be doped to provide an n-type impurity region having a relatively low concentration, and the other portion 142 of the channel region that is adjacent to the power supply voltage region 150 may be doped to provide an n-type impurity having a relatively higher concentration, so that the voltage potential of the channel region of the reset transistor increases from the floating diffusion region 130 (FD) to the power supply voltage region 150.

In addition, the width of the portion 141 of the channel region of the reset transistor doped with a p-type impurity (or with an n-type impurity to provide an impurity region having a relatively low concentration) may vary in different embodiments. For example, the above doping operation can be performed in the half of the channel region that is adjacent to the floating diffusion region 130 (FD). To this end, a photoresist pattern (not shown) having a smaller width than a region in which the reset gate 140 (RG) is to be disposed, may be formed on the substrate, and a p-type impurity or an n-type impurity having a relatively low concentration may be implanted into the substrate using the photoresist pattern as a mask.

As another example, electrons in the floating diffusion region 130 (FD) may leak through a device isolation layer, for example, a device isolation layer 1001 formed using a shallow trench isolation (STI) process. To reduce and/or prevent the leakage, peripheral or edge portions of the floating diffusion region 130 (FD) may be doped with a second conductivity type (for example, a p-type) impurity. As illustrated in FIG. 2, a peripheral portion of the floating diffusion region 130 (FD) may be surrounded with a p-type impurity 1002. Furthermore, in order to prevent a leakage current that may occur through the device isolation layer 1001, a p-type impurity can be formed at the periphery circumference of the photodiode 110.

When the floating diffusion region 130 (FD) and the device isolation layer are separated from each other by using a p-type impurity, the peripheral portions of the floating diffusion region 130 (FD) may be doped with the same or similar component as or to a p-well formed by injecting a p-type impurity into a semiconductor substrate, or p-well may be formed at the periphery of the floating diffusion region 130 (FD) by using the same fabrication step and/or process as a process of forming a p-well. Due to the presence of the p-well, electron flow between the floating diffusion region 130 (FD) and the device isolation layer can be reduced and/or prevented so that the leakage current in the floating diffusion region 130 can be reduced and/or prevented.

Figure 3:
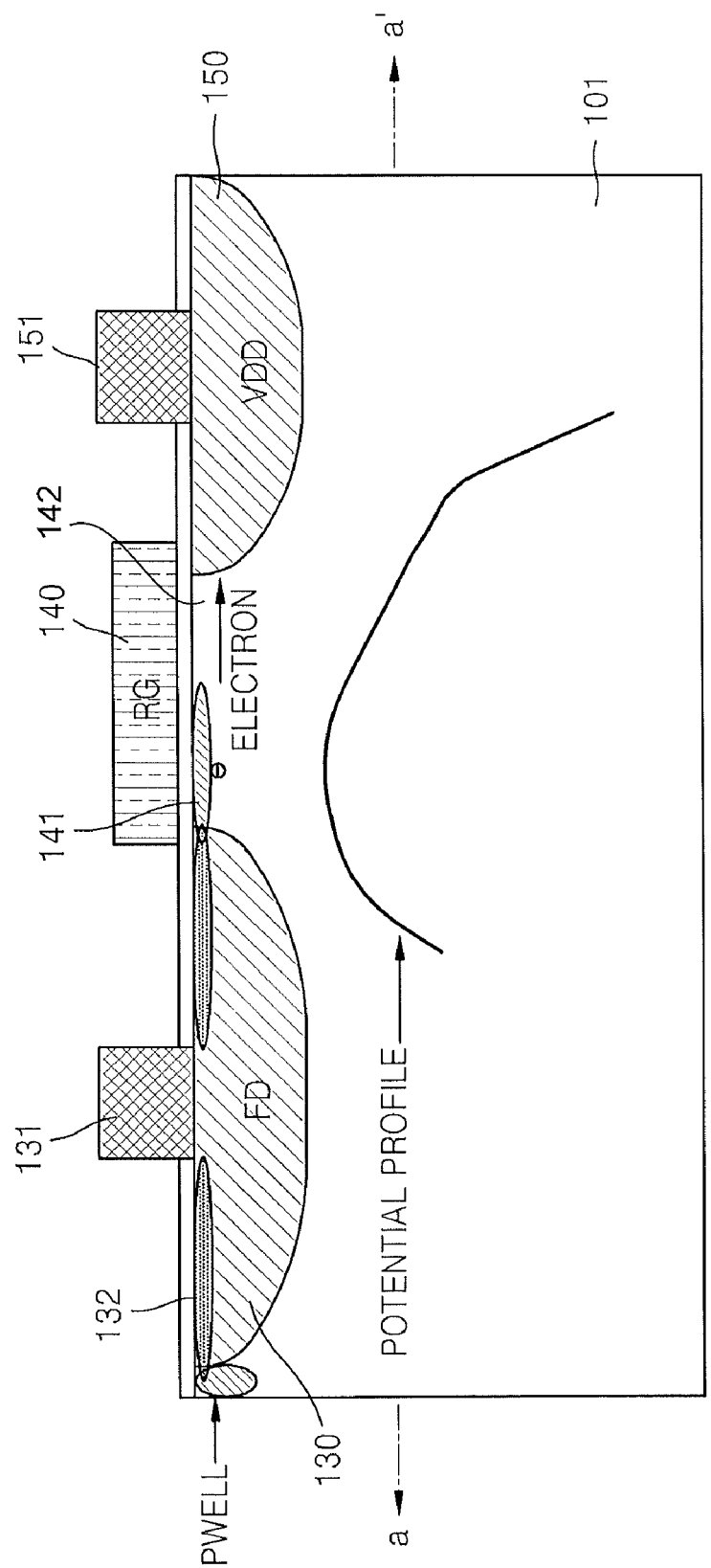
FIG. 3 is a cross-sectional view of the CMOS image sensor (CIS) of FIG. 2 taken along line a-a' according to some embodiments of the present invention.

The detailed structure of the CIS according to some embodiments of the present invention will now be described with reference to FIG. 3. FIG. 3 is a cross-sectional view of the CMOS image sensor (CIS) of FIG. 2 taken along line a-a' according to some embodiments of the present invention.

As illustrated in FIG. 3, the floating diffusion region 130 (FD) and the power supply voltage region 150 are formed in a semiconductor substrate 101 for implementing a CMOS image sensor 100, by doping the substrate 101 with a first type or second type impurity. The illustration of the photodiode 100 is omitted by the cut direction of FIG. 2.

Still referring to FIG. 3, a p-well is formed at a portion of and/or the entire periphery of the floating diffusion region 130. In particular, the p-well is used to intercept the movement of electrons between the floating diffusion region 130 and the device isolation layer. The p-well may be formed only at peripheral portions of the floating diffusion (FD) region 130 adjacent to the device isolation layer in some embodiments.

Meanwhile, a region between the floating diffusion region 130 (FD) and the power supply voltage region 150 corresponds to a channel region of the reset transistor. The reset gate 140 (RG) is disposed on the channel region of the reset transistor. The reset gate 140 (RG) is isolated from the channel region by a gate oxide layer. In addition, the contact 151 is formed at a portion of the power supply voltage region 150, and the power supply voltage region 150 is connected to a power supply voltage VDD source through the contact 151.

Due to the doping of the channel region to provide a p-type impurity region or an n-type impurity region having a relatively low concentration at the portion 141 of the channel region that is adjacent to the floating diffusion region 130, a potential profile of an electron in the channel region of the reset transistor may be generated, as illustrated in FIG. 3. In other words, the built-in voltage potential of the channel region 142 that is adjacent to the power supply voltage region 150 is higher than the built-in voltage potential of the channel region 141 in which the p-type impurity or the n-type impurity having low concentration is doped so that electrons in the channel region of the reset transistor may be moved to the power supply voltage region 150 when the reset transistor is in an on-state.

According to other embodiments of the inventive concept, in order to reduce electron accumulation at the surface of the floating diffusion region 130 (FD) a surface of the floating diffusion region 130 (FD) may be doped with a second conductivity type impurity to a predetermined, relatively shallow depth. The second conductivity type impurity may be an impurity that is used when a p-type photodiode is formed, as an example. In addition, a p+ or p-type impurity may be used as a dopant according to the desired concentration of the impurity region to be formed.

In addition, when the p-type impurity is doped into the surface of the floating diffusion region 130 (FD), the p-type impurity may be doped into only a surface 132 of a first region of the floating diffusion region 130 (FD), on which a contact will not be formed in a subsequent step. As such, the surface 132 of the first region of the floating diffusion region 130 is formed of a second conductivity type. In addition, the floating diffusion region 130 is electrically connected to a gate of a transistor (for example, a drive transistor) disposed in a unit pixel of the CIS. To this end, a contact 131 is disposed in a second region of the floating diffusion region 130 (FD), which does not include the p-type impurity region at the surface thereof. In other words, the p-type impurity region 132 is not provided at the surface of the second region of the floating diffusion region 130 so that the region in contact with the contact 131 is maintained at the first type (e.g., n-type conductivity).

The contact 131 is a conductive material disposed to electrically connect the floating diffusion region 130 and the drive transistor (not shown). In some embodiments, a stud formed of polysilicon may be used as the contact 131.

As described above, the surface of the floating diffusion region 130 (FD) is doped using a p-type doping mask so that the p-type impurity can be further doped into only the surface 132 of the first region of the floating diffusion region 130. The p-type impurity may be further doped into the surface of the photodiode when the doping mask is used so that electrons generated in the surface of the photodiode can be reduced.

Figure 4:
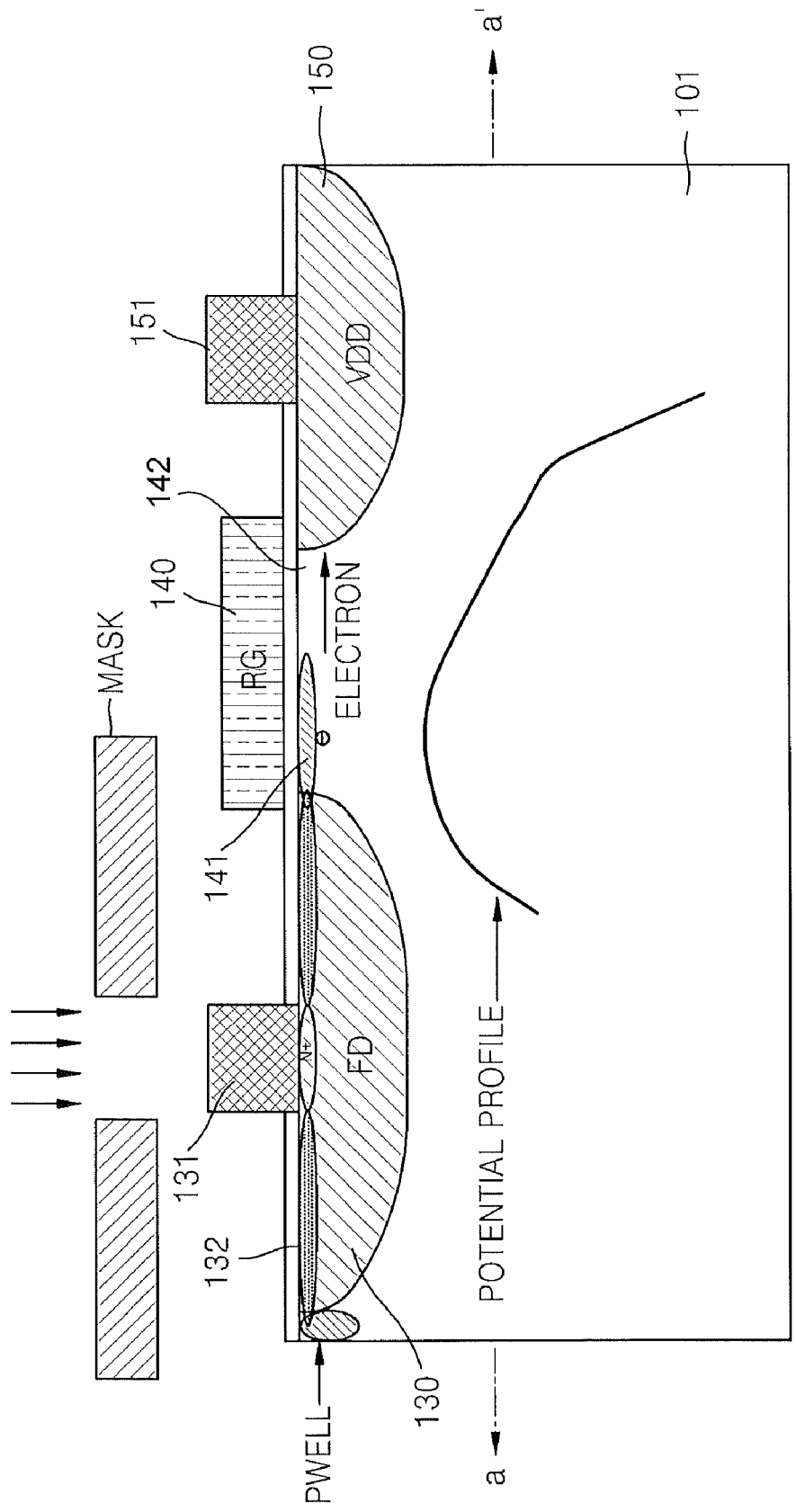
FIG. 4 is a cross-sectional view of the CIS of FIG. 2 taken along line a-a' according to other embodiments of the present invention.

FIG. 4 is a cross-sectional view of the CIS of FIG. 2 taken along line a-a' according to other embodiments of the present invention. The embodiments of FIG. 4 include several elements similar to those of FIG. 3, and thus, a detailed description thereof will be omitted.

As illustrated in FIG. 4, a p-type impurity is doped into the portions of surface 132 of first region of the floating diffusion region 130, and an n-type impurity is doped into the surface of another region (e.g., a second region) but not substantially into the surface 132 of the first region. In particular, when the contact 131 is formed directly on the surface of the floating diffusion region 130, deterioration in electrical characteristics due to the damage of the corresponding portion may occur. In order to reduce and/or prevent this deterioration, a first conductivity type impurity (for example, an n+ type impurity) having a relatively high concentration can be doped into the surface of the second region by using a mask corresponding to the second region to provide a relatively high concentration of the first conductivity type impurity therein.

In addition, the second region including the n-type impurity having a relatively high concentration therein may have a higher concentration compared to that of the floating diffusion region 130. After the n-type impurity is doped into the surface of the second region, a contact is formed on the surface of the second region such that deterioration in the characteristic of the floating diffusion region 130 can be reduced and/or prevented.

As described above, a leakage current that may occur in a floating diffusion region FD and a reset transistor of a CMOS image sensor (CIS) can be reduced such that deterioration of image quality may be reduced and/or prevented.

While embodiments illustrating the inventive concept have been particularly shown and described herein, it will be understood that various changes in form and details may be made therein without departing from the spirit and scope of the following claims.

That which is claimed:

1. A complementary metal-oxide-semiconductor (CMOS) image sensor (CIS), comprising:
   a semiconductor substrate including a photodiode therein as a light sensing unit;
   a floating diffusion region of a first conductivity type in the semiconductor substrate and configured to receive charges generated in the photodiode;

a power supply voltage region of the first conductivity type in the semiconductor substrate;

a reset transistor comprising a reset gate electrode on a surface of the substrate between the floating diffusion region and a power supply voltage region and configured to discharge charges stored in the floating diffusion region in response to a reset control signal, the reset transistor comprising a channel region in the substrate extending between the floating diffusion region and the power supply voltage region such that the floating diffusion region and the power supply voltage regions define source/drain regions for the reset transistor; and an impurity region in a first portion of the channel region adjacent to the floating diffusion region, the impurity region having a doping such that the first portion of the channel region adjacent to the floating diffusion region has a different built-in potential than a second portion of the channel region adjacent to the power supply voltage region, wherein the second portion of the channel region adjacent to the power supply voltage region has a higher voltage potential than the first portion of the channel region adjacent to the floating diffusion region, wherein the impurity region in the first portion of the channel region comprises a second conductivity type different from the first conductivity type, and wherein the second portion of the channel region comprises the first conductivity type.

2. The CMOS image sensor of claim 1, wherein the first conductivity type comprises n-type, and wherein the second conductivity type comprises p-type.

3. The CMOS image sensor of claim 1, wherein a peripheral portion of the floating diffusion region comprises a second conductivity type impurity region between the floating diffusion region and a device isolation layer.

4. The CMOS image sensor of claim 1, wherein the floating diffusion region comprises a first region of a second conductivity type at a surface thereof and a second region of the first conductivity type at the surface thereof adjacent the first region, wherein the CMOS image sensor further comprises:

a conductive layer on the second region, wherein the conductive layer is configured to electrically connect the floating diffusion region to another device.

5. The CMOS image sensor of claim 4, wherein the second region at the surface of the floating diffusion region comprises a first conductivity type impurity at a higher concentration than other portions of the floating diffusion region, and wherein the conductive layer is on the second region including the higher concentration of the first conductivity type impurity therein.

6. The CMOS image sensor of claim 4, wherein the conductive layer comprises polysilicon.

7. The CMOS image sensor of claim 1, wherein the first portion of the channel region adjacent to the floating diffusion region has a different conductivity than the second portion of the channel region adjacent to the power supply voltage region.

8. A complementary metal-oxide-semiconductor (CMOS) image sensor (CIS), comprising:

a semiconductor substrate including a photodiode therein as a light sensing unit;

a floating diffusion region of a first conductivity type in the semiconductor substrate and configured to receive charges generated in the photodiode, the floating diffusion region comprising a first region of a second conductivity type at a surface thereof and a second region of the first conductivity type at the surface thereof adjacent the first region, wherein the second conductivity type is different from the first conductivity type;

a power supply voltage region of the first conductivity type in the semiconductor substrate;

a reset transistor comprising a reset gate electrode on a surface of the substrate and a channel region extending between the floating diffusion region and the power supply voltage region beneath the reset gate electrode such that the floating diffusion region and the power supply voltage regions define source/drain regions for the reset transistor, wherein a first portion of the channel region adjacent to the floating diffusion region comprises the second conductivity type and a second portion of the channel region adjacent to the power supply voltage region comprises the first conductivity type, and wherein the reset transistor is configured to discharge the charges stored in the floating diffusion region in response to a reset control signal; and a conductive layer on the second region of the floating diffusion region and configured to electrically connect the floating diffusion region to another device.

9. The CMOS image sensor of claim 8, wherein the second region at the surface of the floating diffusion region comprises a first conductivity type impurity at a higher concentration than other portions of the floating diffusion region, and wherein the conductive layer is on the second region including the higher concentration of the first conductivity type impurity therein.

10. The CMOS image sensor of claim 8, wherein at least a portion of a periphery of the floating diffusion region comprises a second conductivity type impurity region between the floating diffusion region and a device isolation layer.

11. The CMOS image sensor of claim 8, wherein the first conductivity type comprises n-type, and wherein the second conductivity type comprises p-type.

12. A complementary metal-oxide-semiconductor (CMOS) image sensor (CIS) comprising:

a semiconductor substrate including a photodiode therein as a light sensing unit;

a floating diffusion region of a first conductivity type in the semiconductor substrate and configured to receive charges generated in the photodiode;

a power supply voltage region of the first conductivity type in the semiconductor substrate;

a reset transistor comprising a reset gate electrode on a surface of the substrate and a channel region extending between the floating diffusion region and the power supply voltage region beneath the reset gate electrode such that the floating diffusion region and the power supply voltage regions define source/drain regions for the reset transistor, wherein a first portion of the channel region adjacent to the floating diffusion region comprises a second conductivity type and a second portion of the channel region adjacent to the power supply voltage region comprises the first conductivity type, wherein the second conductivity type is different from the first conductivity type, and wherein the reset transistor is configured to discharge the charges stored in the floating diffusion region in response to a reset control signal;

a device isolation layer on the substrate adjacent to the floating diffusion region; and an impurity region of the second conductivity type in the substrate separating the floating diffusion region from the device isolation layer.

13. The CMOS image sensor of claim 12, wherein the impurity region completely surrounds a periphery of the floating diffusion region.

14. The CMOS image sensor of claim 12, wherein the channel region has a doping such that a built-in potential of the first portion of the channel region that is adjacent to the floating diffusion region and a built-in potential of the second portion of the channel region that is adjacent to the power supply voltage region are different.

15. The CMOS image sensor of claim 14, wherein the floating diffusion region comprises a first region of the second conductivity type at a surface thereof, and a second region of the first conductivity type at the surface thereof adjacent the first region, and further comprising:
   a conductive layer on the second region and configured to be electrically connected to another device.

16. The CMOS image sensor of claim 12, wherein the channel region has a non-uniform doping such that the first portion of the channel region that is adjacent to the floating diffusion region has a different conductivity than the second portion of the channel region that is adjacent to the power supply voltage region.

17. The CMOS image sensor of claim 12, wherein the first conductivity type comprises n-type, and wherein the second conductivity type comprises p-type.

* * * * *